(12) United States Patent
Chan et al.

(10) Patent No.: US 8,575,699 B2
(45) Date of Patent: Nov. 5, 2013

(54) THIN BOX METAL BACKGATE EXTREMELY THIN SOI DEVICE

(71) Applicant: International Business Machines Corporation, Armonk, NY (US)

(72) Inventors: Kevin K. Chan, Staten Island, NY (US); Zhibin Ren, Hopewell Jct., NY (US); Xinhui Wang, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/736,994

(22) Filed: Jan. 9, 2013

(65) Prior Publication Data
US 2013/0122665 A1 May 16, 2013

Related U.S. Application Data

(62) Division of application No. 12/724,555, filed on Mar. 16, 2010, now Pat. No. 8,431,994.

(51) Int. Cl.
H01L 27/12 (2006.01)
(52) U.S. Cl.
USPC ..... 257/347; 257/349; 257/350; 257/E21.564

(58) Field of Classification Search
USPC ................ 438/282, 216, 261, 421, 591, 595; 257/349, 350, E21.564
See application file for complete search history.

(56) References Cited

U.S. PATENT DOCUMENTS

| 2007/0200157 A1 | 8/2007 | Shino |
| 2009/0108352 A1 | 4/2009 | Majumdar et al. |
| 2009/0311836 A1 | 12/2009 | Cartier et al. |
| 2010/0038686 A1 | 2/2010 | Maitra et al. |

Primary Examiner — Samuel Gebremariam
(74) Attorney, Agent, or Firm — H. Daniel Schnurmann

(57) ABSTRACT

SOI structures with silicon layers less than 20 nm thick are used to form ETSOI semiconductor devices. ETSOI devices are manufactured using a thin tungsten backgate encapsulated by thin nitride layers to prevent metal oxidation, the tungsten backgate being characterized by its low resistivity. The structure includes at least one FET having a gate stack formed by a high-K metal gate and a tungsten region superimposed thereon, the footprint of the gate stack utilizing the thin SOI layer as a channel. The SOI structure thus formed controls the Vt variation from the thin SOI thickness and dopants therein. The ETSOI high-K metal backgate fully depleted device in conjunction with the thin BOX provides an excellent short channel control and lowers the drain induced bias and sub-threshold swings. The structure supports the evidence of the stability of the wafer having a tungsten film during thermal processing, during STI and contact formation.

13 Claims, 5 Drawing Sheets

THIN BOX METAL BACKGATE EXTREMELY THIN SOI DEVICE

RELATED APPLICATIONS

This is a divisional application of co-pending U.S. application Ser. No. 12/724,555, filed on Mar. 16, 2010.

FIELD OF THE INVENTION

The present invention relates generally to semiconductor devices, and more particularly, to CMOS thin-BOX Backgate Extremely Thin Silicon-On-Insulator (ETSOI) devices to reduce short-channel effects by using metal backgate control.

BACKGROUND AND RELATED ART

With shrinking dimensions of various integrated circuit components, transistors such as field-effect transistors (FETs) have experienced dramatic improvement in both performance and power consumption. These improvements may be largely attributed to the reduction in dimensions of components used therein, which in general translate into reduced capacitance, resistance, and increased through-put current from the transistors. Nevertheless, performance improvement brought up by this type of "classic" scaling, in device dimensions, has recently met obstacles and in some cases even been challenged, when the scaling goes beyond a certain point, by the increase in leakage current and variability that are inevitably associated with the continued reduction in device dimensions. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

The design of ever-smaller planar transistors with short channel lengths makes it necessary to provide very shallow source/drain junctions. Shallow junctions are necessary to avoid lateral diffusion of implanted dopants into the channel, since such diffusion disadvantageously contributes to leakage currents and poor breakdown performance. Shallow source/drain junctions, with a thickness of about 30 nm to 100 nm, are generally required for acceptable performance in short channel devices. Silicon-on-insulator (SOI) technology allows the formation of high-speed, shallow-junction devices. In addition, SOI devices improve performance by reducing parasitic junction capacitance.

In an SOI substrate, a buried oxide (BOX) film made of silicon oxide is formed on single crystal silicon, and a single crystal silicon thin film is formed thereon. Various methods of fabricating such SOI substrates are known, one of which is Separation-by-Implanted Oxygen (SIMOX), wherein oxygen is ion implanted into a single crystal silicon substrate to form a BOX film. Another method of forming an SOI substrate is wafer bonding, wherein two semiconductor substrates with silicon oxide surface layers are bonded together at the silicon oxide surfaces to form a BOX layer between the two semiconductor substrates.

Shallow junction transistors use shallow trench isolation (STI) techniques to separate devices and circuits. STI techniques significantly increase the manufacturing cost because the STI process requires a large number of processing steps and apparatus, such as thermal oxidation, silicon nitride chemical vapor deposition (CVD), silicon nitride wet etch, reactive ion etch (RIE), high density plasma (HDP) silicon oxide deposition, wet clean, chemical-mechanical polishing (CMP), and photolithography. Uniformity and yield of wafers is also a concern in view of the additional processing steps necessitated for STI processing.

Scaling CMOS devices has pushed the number of parameters out of a negligible region to the point of becoming a significant circuit design factors. One of the important device parameters is the short-channel control and Extremely thin Silicon-On-Insulator (ETSOI), both becoming a new class of transistors designed for this propose. ETSOI, a fully depleted charge carriers transistor device, (i.e., having a concentration of charge carriers present at 300K in the channel in the order of $10^3$ atoms/cm$^3$ or less), uses an ultra-thin silicon channel wherein the majority carriers are fully depleted (FD) during operation. The challenge of this class of transistors is its Vt variation and high extrinsic resistance (Rext).

The FDSOI transistor threshold voltage Vt varies as a function of the first power order of the channel dopant, which is also due to the atomical channel silicon thickness variation rather than the 0.4 order for a conventional PDSOI device. This is because of the compensation factor in a partially depleted (PD) FET, which captures the change of the depletion depth with the doping, and which does not exist in a fully depleted device. As a result, Vt varies more strongly with the doping variation, such as random doping fluctuations.

Moreover, an entirely new factor, i.e., the body thickness variation, is introduced. Since the ETSOI devices are fully depleted, changes in body thickness result in changes in the charge in the body which, by Gauss' law, results in changes in the channel potential, altering the threshold voltage.

Many advanced transistor structures aiming at reducing short-channel effects (SCE) includes drain induced bias lowering (DIBL) and sub-threshold swing. As the transistor become smaller, SCE has shown to be the dominant factor. Accordingly, structures such as UTSOI, ETSOI Backgate and Double gate, employ a very thin silicon channel which is fully depleted of majority carriers during operation, providing a superior control on the SCE. Backgate device holds the promise of the relief of random doping fluctuations since Vt can be set by the backgate potential, reducing the dependence of channel doping.

As transistors shrink further in dimension, the ability to scale down the gate length of conventional bulk silicon MOSFET diminishes due to SCE. Single Gate Fully Depleted Semiconductor-on-Insulator (FDSOI) technology has been established as one solution to reduce SCE as well as to reduce unwanted parasitic capacitances.

However, the Single Gate FDSOI technology may require a stringent thickness requirement and uniformity control of the thin silicon film on insulator to achieve full depletion. Additionally, the aforementioned Drain-Induced Virtual Substrate Biasing (DIVSB) effect is another challenge for Single Gate FDSOI technology. In contrast, Double-Gate FDSOI technology may necessitate a less stringent requirement on the thickness of a semiconductor on insulator, may reduce the Drain Induced Virtual Substrate Biasing (DIVSB) effect, and may maintain better SCE control and high trans-conductance.

For illustrative purposes, and with reference to FIG. 1, a prior art extremely-thin SOI device is shown that includes a buried oxide layer 110 on a substrate 100, an ETSOI layer 120 on the buried oxide layer, and a gate stack on the ETSOI layer. The gate stack includes a high-k oxide layer 131 upon the ETSOI layer, followed by a high-k metal gate (MGHK) 132 superimposed on top of the high-k oxide layer. A metal region 133 is positioned above the MGHK layer. Each of the raised source/drain regions (RSD) 130 is placed on the ETSOI layer, abutting at spacers 150.

In a first aspect, an embodiment of the invention describes a novel backgate tungsten with the raised source/drain regions (RSD) 130 is placed on the ETSOI layer, abutting at spacers 150.

Conventional ETSOI device provided with a thick buried oxide Box 105 have experimentally demonstrated that Short Channel Effect (SCE) can only improve by approximately 20 to 40%. As further scaling of HKMG gate stack dimension, a better SCE control is needed.

The thickness of ETSOI layer 105 ranges from 6 nm to 20 nm. Due to the extremely thin SOI layer 105, the active SD and Extension regions experience create difficulties for dopant implants and activation annealing. Although implants can be conducted, only partial dopants are activated due to lack of silicon re-crystallization. The sheet resistance from both active regions is so elevated that its electrostatic performance is severely degraded. Employing a raised source/drain (RSD) 130 can be used to levitate this issue partially, but it is the Extension resistance that remains the dominant factor for performance degradation. In-situ doping RSD is another technique used for ETSOI devices and high RTA (rapid thermal annealing) temperature is incorporated therein to reduce the resistivity and drive dopants under HKMG stack. Because halo implant for a good Vt control is not applicable, resulting in a high Vt and device punch-through.

In view of the aforementioned considerations, there is a need for ETSOI devices having a separate backgate enabling on-demand Vt adjustments that is not available in single gate or tied-double gate devices in order to improve the control of Vt variations due to channel dopants and silicon body thickness.

SUMMARY

In a first aspect, the invention describes a novel backgate transistor to resolve the SCE problem so as to allow small transistor improved performance and on-demand Vt adjustments.

In another aspect, an embodiment of the invention describes an ETSOI semiconductor device with a thin insulator that includes thin oxide and nitride insulators. The embodiment describes an extremely thin SOI semiconductor device with a thin oxide and nitride insulator on a tungsten layer or film used as backgate. The use of tungsten is particularly relevant in view of the expected formation of tungsten oxide when at temperatures above 600° C. and in the presence of oxygen. The basic structure of the present invention that contains and protects the tungsten film avoids the formation of the aforementioned tungsten oxide.

In still another aspect, an embodiment of the invention provides an ETSOI high-k metal gate (MGHK) fully depleted SOI device (FDSOI), wherein tungsten backgate is encapsulated by a thin film nitride low resistivity that prevents metal oxidation during fabrication. The ETSOI and ultra thin Box provide a semiconductor structure displaying an excellent short channel control, and significantly improves the drain induced bias lowering (DIBL) and sub-threshold swing. The semiconductor structure includes nFETs and pFETs with backgate metal, which are separated by an STI, and which can be independently biased.

In yet another aspect, an embodiment of the invention provides a method of forming a thin-BOX metal backgate extremely thin SOI device that includes: providing a substrate of an extremely thin SOI, ranging from 6 to 8 nm on a thin silicon dioxide layer, preferably in the range of 10 nm, and an extremely thin silicon nitride layer, preferably ranging from 5 to 10 nm, followed by a tungsten layer with a thickness ranging from 10 to 20 nm, and followed by on extremely thin silicon nitride deposition between 5 to 10 nm on top of a thick BOX, preferably made of silicon dioxide and having a depth ranging from 130 nm to 200 nm on top of the silicon substrate. A shallow trench isolation (STI) provides an isolation barrier between the pFET and nFET devices. Reactive Ion etching (RIE) is used to open a trench down to the BOX, with silicon nitride providing the isolation. The trench is then filled with oxide. Both pFET and nFET of the ETSOI devices are fabricated with a raised source and drain (RSD) in the SD active region. Trenches are opened by RIE to contact the backgate metal. A spacer is formed to provide isolation between the RSD and backgate metal. Contact trenches can be filled with evaporated metal for the BG (backgate) contact.

In still another aspect, an embodiment of the invention provides an extremely-thin silicon-on-insulator (ETSOI) device that includes: a first buried oxide (BOX) layer on a silicon substrate and a backgate metal layer surrounded by an upper and lower layers of thin nitride on top of the BOX; a thin second BOX on the upper thin nitride layer and a thin SOI layer superimposed thereon, wherein the second BOX layer, the upper thin nitride layer, and a thin SOI layer making contact with a spacer; and an FET having a gate stack on top of the thin SOI layer, the gate stack including a dielectric layer at the footprint of the gate stack having the thin SOI layer provide a recessed channel to the FET.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION OF EMBODIMENTS

The present invention will now be described in greater detail by referring to the following discussion and drawings that accompany the present application. It is noted that the drawings of the present application are provided for illustrative purposes only and, as such, they are not drawn to scale. In the following description, numerous specific details are set forth, such as particular structures, components and materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

Moreover, it will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 2 through 9 illustrate an exemplary semiconductor structure of an embodiment of the present invention through various processing steps preferably used for forming a semiconductor device having a thin-box metal backgate extremely thin SOI device.

The extremely thin silicon-on-insulator semiconductor device with selective epitaxial silicon grown from extremely thin SOI with metallic backgate (BG) is described, preferably made of tungsten which is characteristic by its low resistivity, in which the backgate is protected by ultra-thin silicon nitride layers. This and other embodiments of the present invention reduce the short channel effect (SCE) by applying a voltage to the metallic BG to regulate the front gate Vt. Control Vt variations are provided from the thin SOI thickness and dopants.

Figure 1:
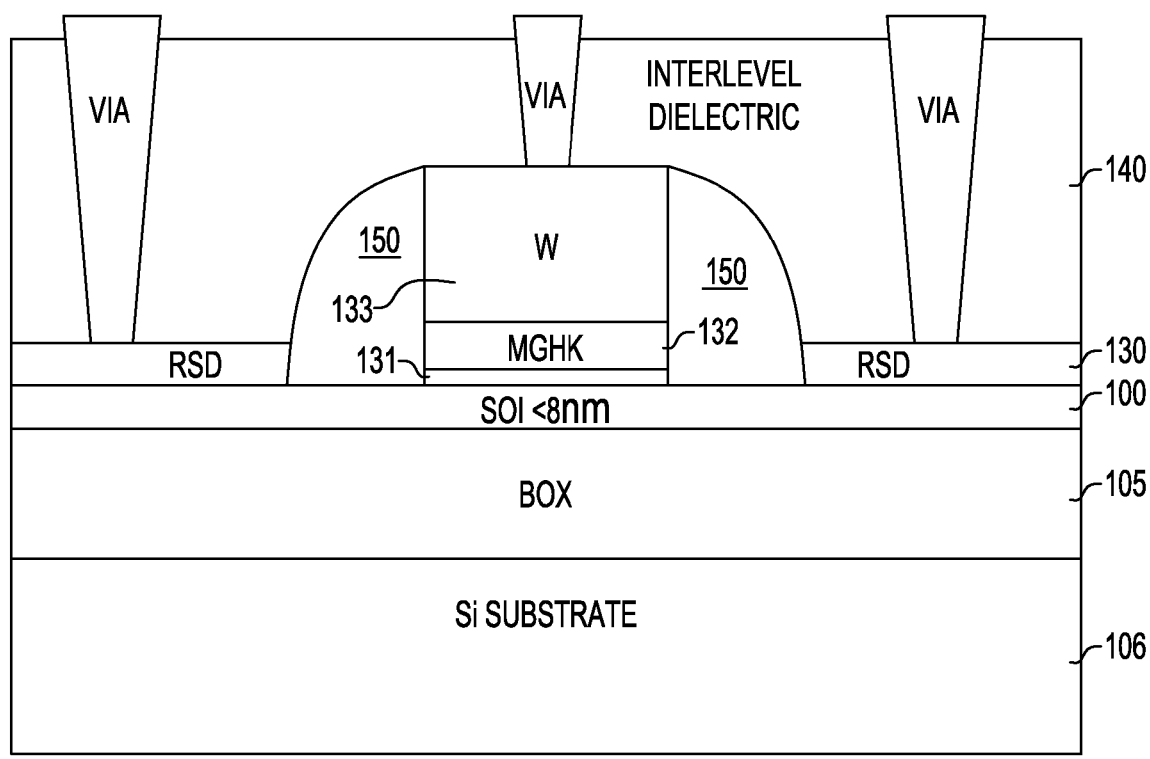
FIG. 1 is a side cross-sectional view of a prior art extremely thin Silicon-on-Insulator (ETSOI) transistor.
Figure 2:
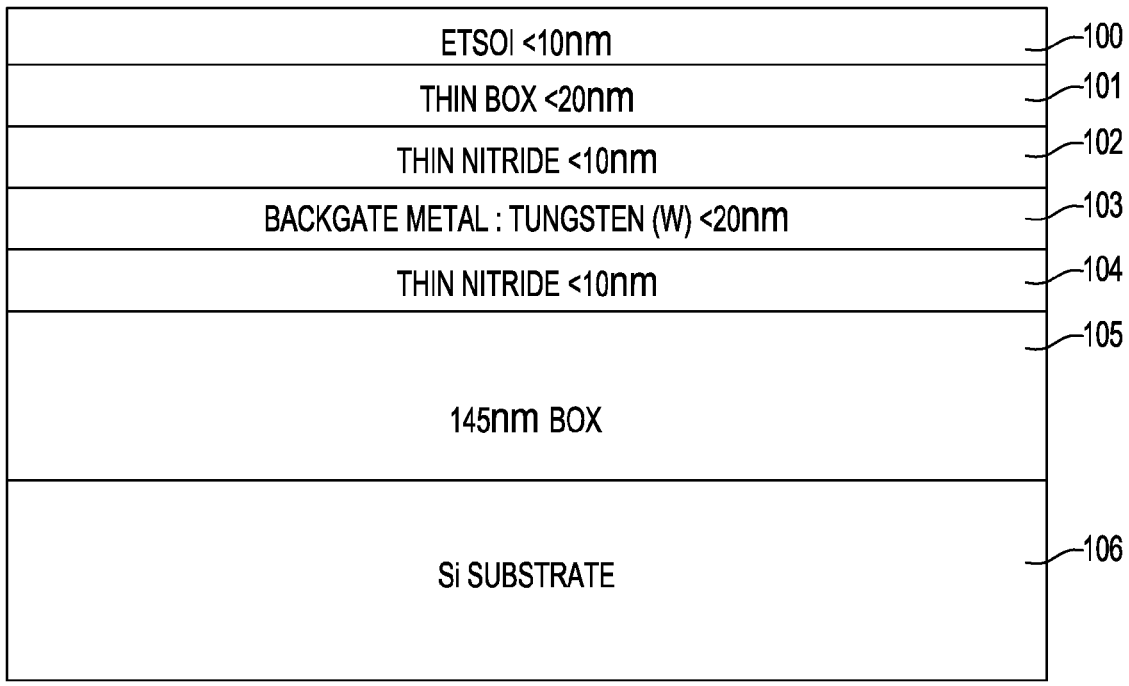
FIG. 2 is a side cross-sectional view of a metal backgate ETSOI substrate, according to an embodiment of the invention.

FIG. 2 depicts an initial structure that can be used in an embodiment of the invention. The initial structure can include an ultra-thin silicon-on-insulator (SOI) layer 100, hereinafter also referred to as extremely-thin SOI channel or ETSOI superimposed on an ultra-thin buried oxide (BOX) layer 101. Below the thin buried oxide 101, an ultra-thin silicon nitride 102 is used to protect a metallic backgate (BG) 103 from delaminating. A second ultra-thin buried dielectric, silicon nitride 104 is deposited to isolate and encapsulate the backgate metal layer 103 from a thick buried oxide (BOX) 105, the thickness preferably of the order of 140 nm to 200 nm. Finally, a silicon substrate 106 is added to act as a handling substrate.

The semiconductor substrate 106 illustrated in FIG. 2 is made of any semiconductor material including, but is not limited to Si, Ge, SiGe, SiC, SiGeC, GaAs, GaN, InAs, InP and all other III/V or II/VI compound semiconductors. Semiconductor substrate 106 can also comprise an organic semiconductor or a layered semiconductor such as Si/SiGe.

The ETSOI channel 100 has a thickness of approximately 3 nm to 10 nm, and is fabricated on top of thin buried BOX 101, with a preferred thickness ranging from 8 nm to 10 nm. The metal backgate (BG) layer 104, preferably having a thickness ranging from 10 nm to 20 nm, is encapsulated between a top thin silicon nitride layer 102 and a bottom thin silicon nitride 104 layer, each layer having a thickness preferably in the range of 5 to 10 nm, protecting the BG layer from delamination.

Figure 3:
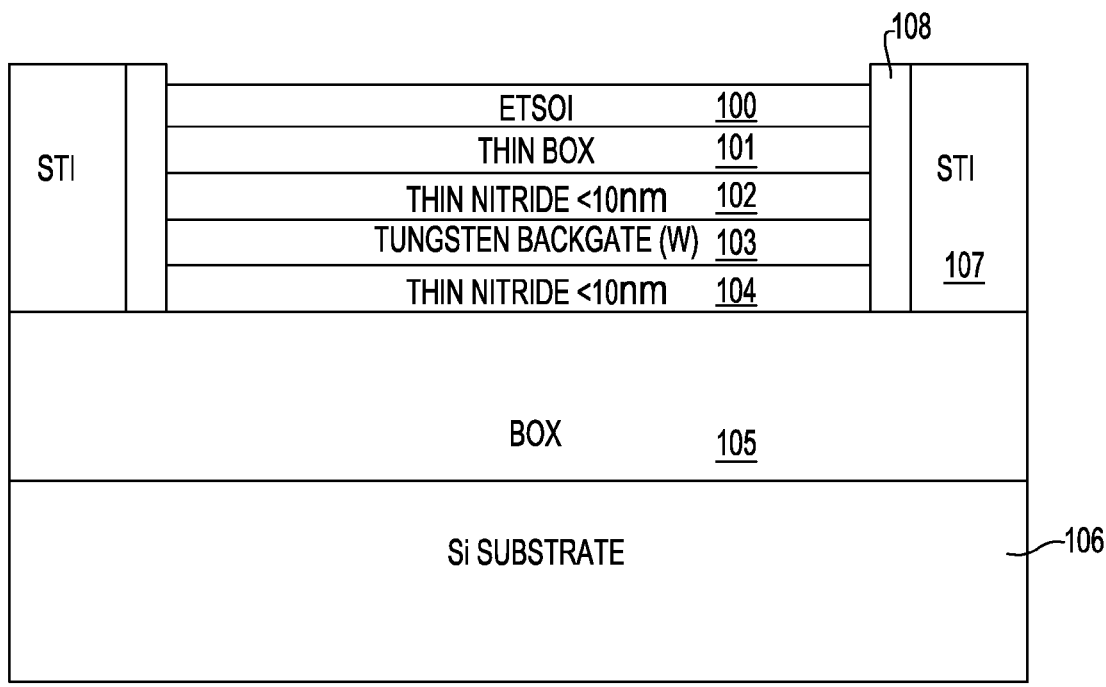
FIG. 3 shows a first fabrication process step and corresponding structure, forming a shallow trench isolation (STI)

Referring to FIG. 3, the initial structure includes a first recess 108 formed in the ET SOI channel 100 to the thick buried oxide BOX 105 and isolation liner of silicon nitride 108 separating metallic BG 104 and channel ETSOI layer 100. Oxide 107 fills the recess forming a Shallow Trench Isolation (STI).

Still referring to FIG. 3, the two layers of ultra-thin silicon nitride 102 and 104, having a preferred thickness of 7 nm or less, are respectively placed above and below the metallic backgate (BG) 104. In an embodiment of the invention, a thin insulator silicon liner 108 separates BG 104 from the shallow trench insulator (STI) oxide fill 107, with the STI acting as an isolation barrier between subsequent pFET and nFET devices (not shown).

Figure 4:
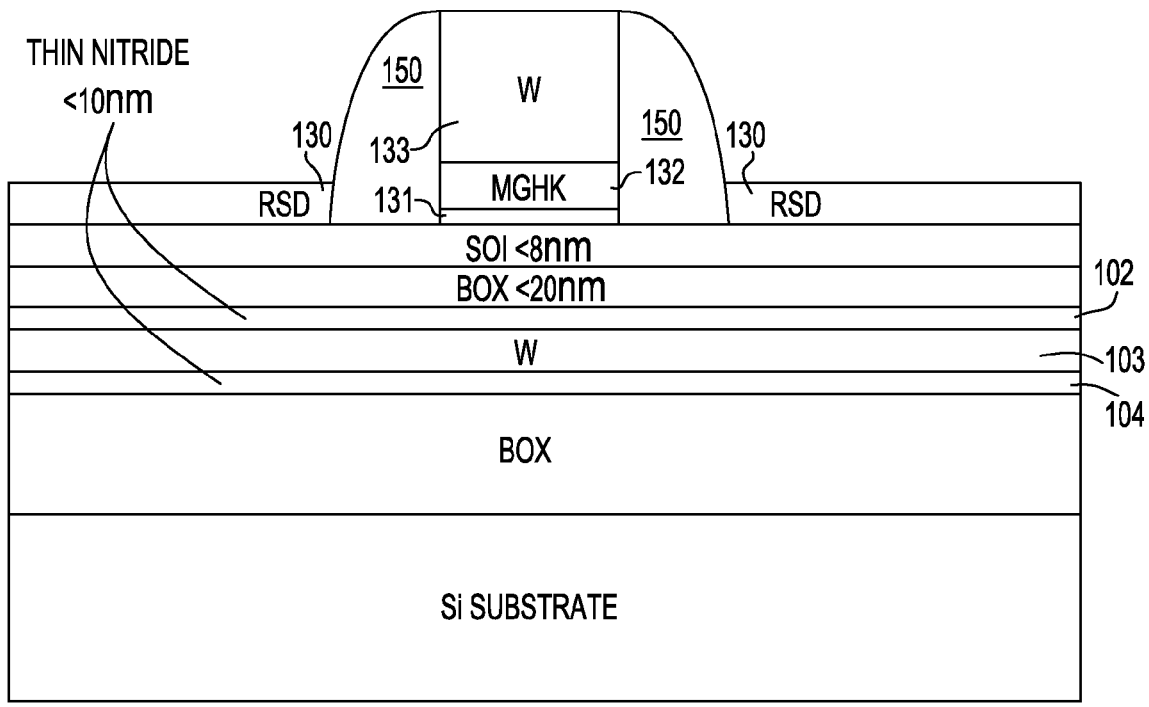
FIG. 4 illustrates the next fabrication step wherein a high-K dielectric and metal backgate are formed.

Reference is now made to FIG. 4 showing a side view of a cross-section of at least one MOSFET semiconductor device. The initial device is provided with a gate stack that includes a high-k oxide layer 131 on an upper surface of the recessed ETSOI channel layer and is followed by a high-k metal gate (MGHK) 132 superimposed on top of the high-k oxide layer. The metal region, preferably made of tungsten 133 because of its low resistivity, is positioned above the MGHK layer. The gate dielectric of gate stack may include an oxide, a nitride, an oxynitride, or multilayered stacks thereof.

High-k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof.

The MOSFET device further includes a source region and a drain region (not shown) located within the ETSOI channel 100 at the footprint of the gate stack. The gate stack can be formed by deposition of various material layers, lithography and etching. Alternatively, a replacement gate process can be used to form the gate stack.

The channel region, located in the ETSOI layer, is positioned directly beneath the gate stack between the source region and the drain region of the MOSFET. At least one spacer 150 is then added on the side walls of the gate stack. In the active source-drain (SD) region, a raised source and drain (RSD) 130 is added, abutting at the spacers.

Figure 5:
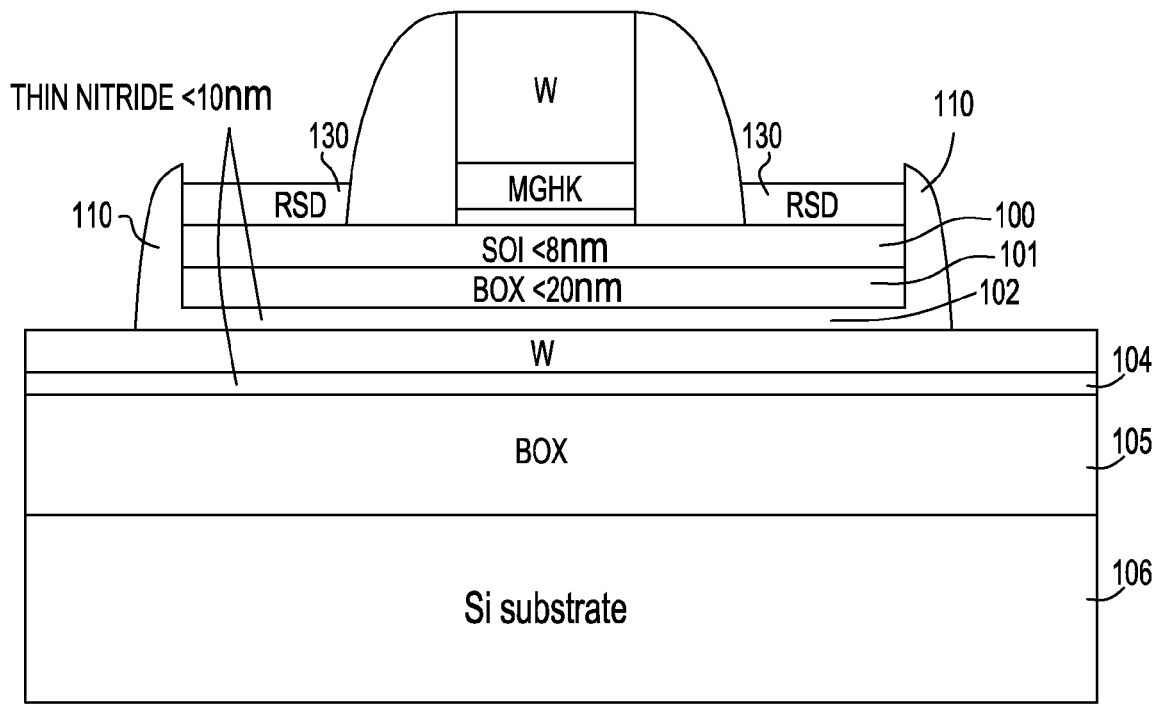
FIG. 5 depicts the fabrication step wherein the backgate contact with corresponding spacer isolation is formed.

FIG. 5 is a schematic diagram depicting the formation of the Backgate (BG) layer. A trench is etched, preferably by Reactive Ion Etching (RIE), stopping at the top of the BG 104 layer. A thick spacer 110, approximately 10 to 15 nm thick is then formed to isolate the ETSOI FET device and the active RSD region 130. The RIE process is extended to open a trench down to the BOX using the silicon nitride as an isolation layer. The trench is then filled with a deposition of oxide. Both pFET and nFET ETSOI devices are advantageously fabricated with a raised source and drain (RSD) 130 in the SD active region.

Figure 6:
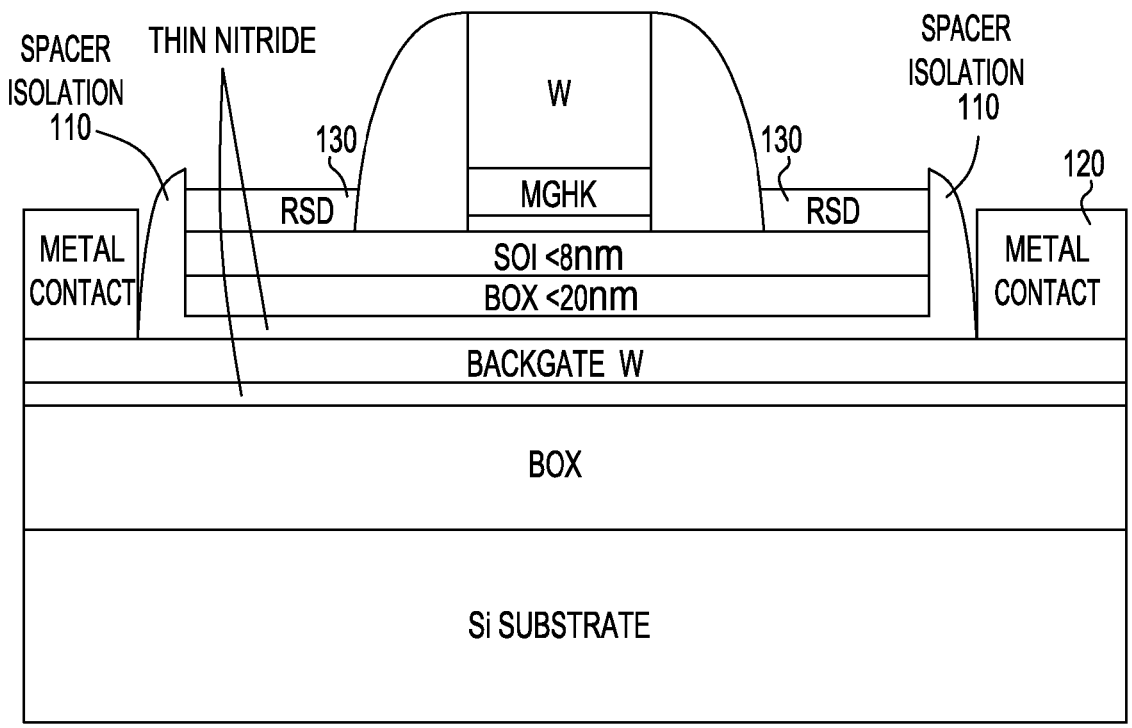
FIG. 6 shows the step in which metal-fill is deposited to contact the backgate.

FIG. 6 is a schematic diagram illustrating the metallic fill 120 from the BG trench, preferably using a selective tungsten fill or some other equivalent metal formed by evaporation.

Figure 7:
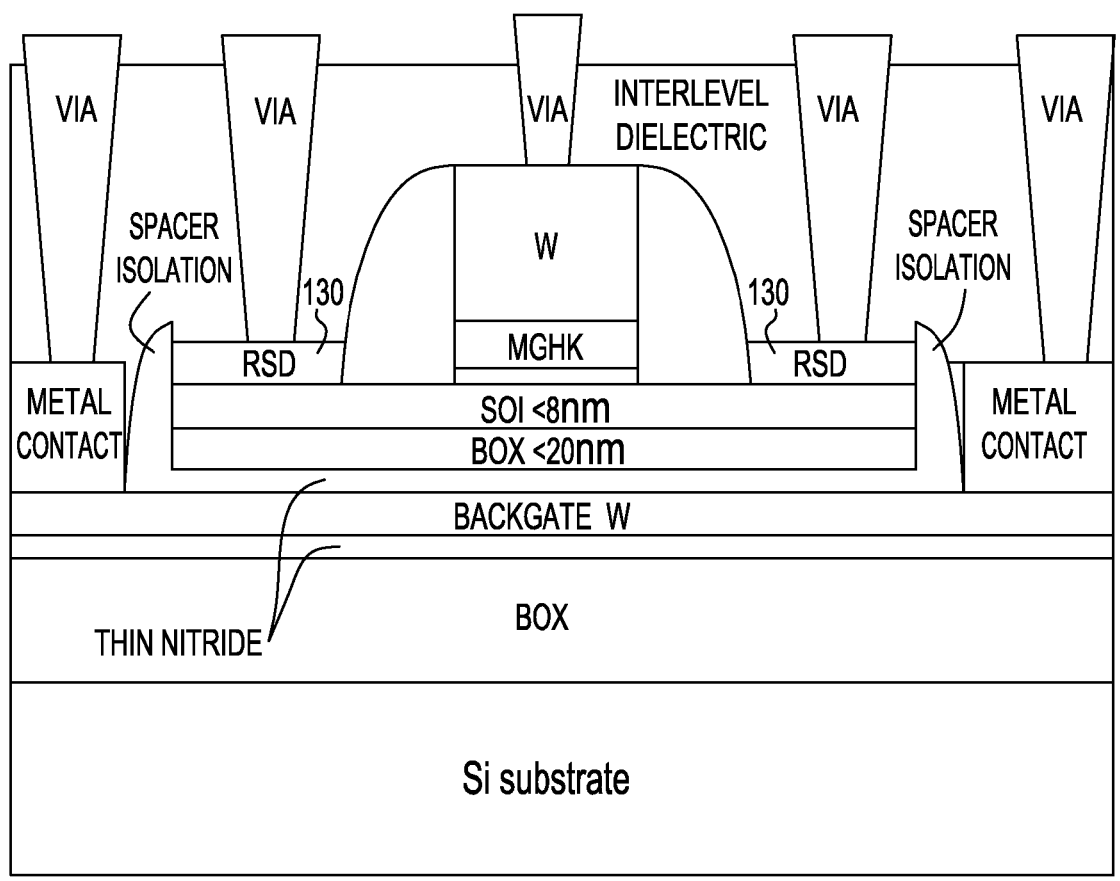
FIG. 7 shows a side cross-sectional view of the final structure illustrating the device with accompanying via-hole contacts, in accordance to an embodiment of the invention.

FIG. 7 shows a side-view of the ETSOI device depicting the raised source and raised drain RSD 130 in the SD region with metallic backgate (BG), protected by ultra-thin silicon nitride layers to avoid delamination. Contact trenches are then opened by RIE to contact to the backgate metal. The contact trenches are filled preferably with evaporated metal for BG contact.

From this point on, conventional fabrication processes can be used to form the remainder of the integrated circuit that includes the ETSOI device. The thin spacer structure enables the ETSOI device to integrate the high-K dielectric and metal gate stack and the epitaxial raised source/drain. The structure thus constructed provides an ETSOI high-k metal gate (MGHK) fully depleted SOI device, in which the metal backgate is encapsulated by the thin film nitride low resistivity, preventing metal oxidation during fabrication. The ETSOI and thin Box provide the semiconductor structure with an excellent short channel control that significantly improves the drain induced bias lowering and sub-threshold swing. The semiconductor structure of an embodiment of the present invention includes nFETs and pFETs backgates devices that can be independently biased.

Figure 8:
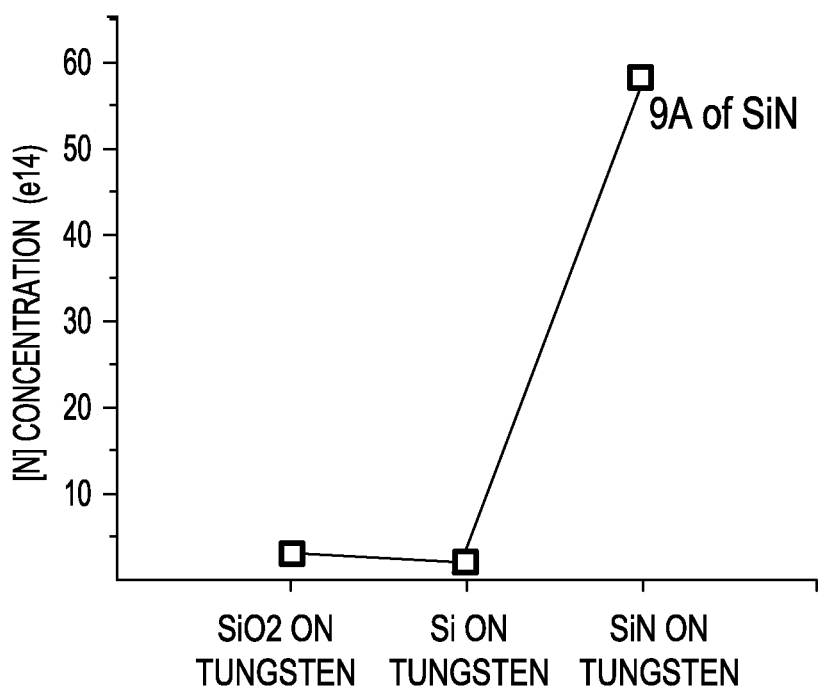
FIG. 8 shows a plot of the results achieved by a Nuclear Reactive Analysis applicable to the ultra-thin nitride layer and the backgate tungsten layer interface.

FIG. 8 shows the use of ultra-thin silicon nitride 102 and 104 to isolate backgate metal Tungsten 103 from oxidizing, in which metallic Tungsten layer 103 delaminates due to volumetric expansion of Tungsten oxide. Nuclear Reactive Analysis (NRA) is used to verify nitrogen concentration on three different films deposited on Tungsten. Both silicon dioxide and silicon on Tungsten surfaces do not show any nitrogen concentration. The ultra-thin silicon nitride 9A provides 6e15 [N] for adequate protection and free of oxidation.

Figure 9:
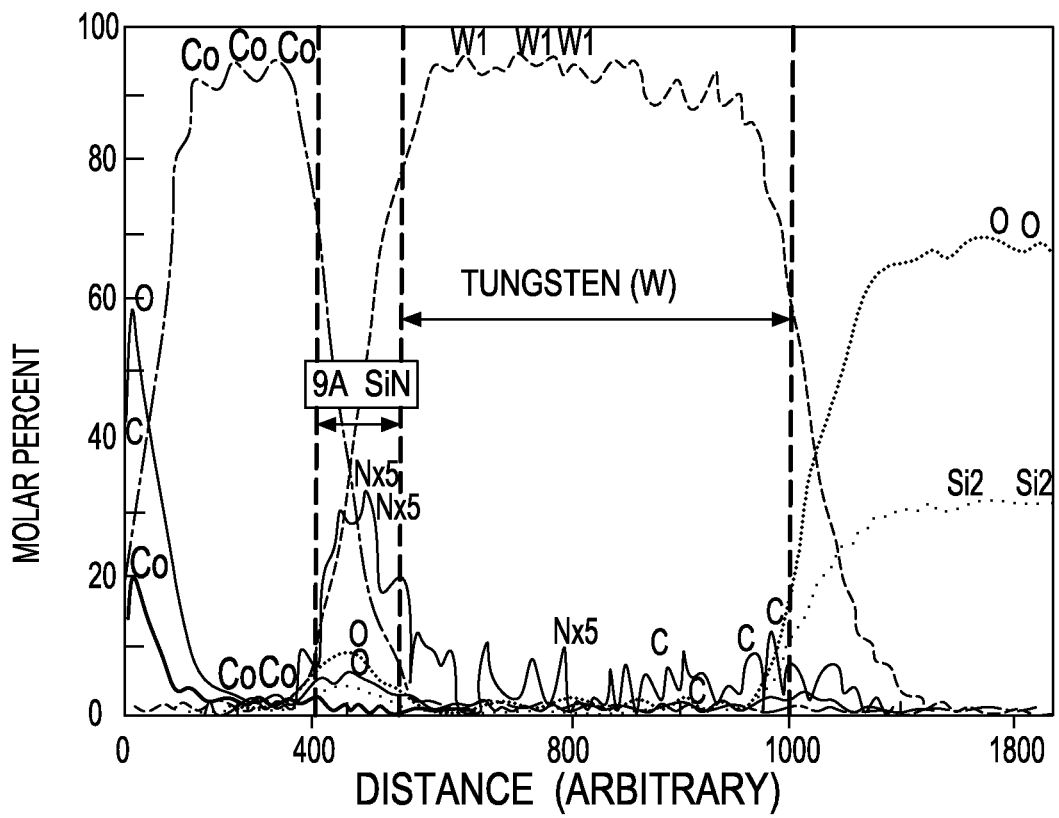
FIG. 9 shows a plot illustrating an Auger profile of the inventive structure and results of an analysis of the tungsten and cobalt capping layer interface shown to be free of oxidation.

FIG. 9 depicts an Auger analysis used to verify the existence of ultra-thin silicon nitride film to protect the metallic Tungsten backgate. A sample consists of silicon nitride film 9A on Tungsten layer on a silicon dioxide surface. A metallic Cobalt cap is deposited on a silicon nitride surface for thickness profiling. The Auger analysis shows a prominent nitrogen peak positioned in between metallic Cobalt cap and Tungsten surface wherein the presence of oxygen is not observed. In contrast, no Nitrogen is detected at the Tungsten and silicon dioxide interface where thin silicon nitride is intentionally omitted. This profiling analysis results conclude that the existence of the ultra-thin silicon nitride 9A deposited on the Tungsten surface is completely free and devoid of oxidation.

In summary, the structure thus constructed minimizes the effect of the short channel. Accordingly, it is important that the thickness of the SOI channel be extremely thin. When the thin SOI thickness is combined with the backgate layer, the combination of the two efficiently controls the short channel effect and dopants therein. Furthermore, the ETSOI high-K metal backgate fully depleted device in conjunction with the thin BOX not only provides an excellent short channel control, but it also significantly lowers the drain induced bias and sub-threshold swings.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

The invention claimed is:

1. A semiconductor device comprising:
   a first buried oxide layer on a silicon substrate and a backgate metal layer surrounded by an upper and lower layers of thin nitride on top of the first buried oxide layer;
   a thin second buried oxide layer on the upper thin nitride layer and a thin silicon-on-insulator (SOI) layer superimposed thereon, wherein the second buried oxide layer, the upper thin nitride layer, and the thin SOI layer make contact to a spacer; and
   an FET having a gate stack on top of the thin SOI layer, the gate stack including a dielectric layer at the footprint of the gate stack having the thin SOI layer provides a recessed channel to the FET.

2. The semiconductor device as recited in claim 1, wherein the gate stack further comprises a high-k oxide layer superimposed on the upper surface of the extremely thin silicon-on-insulator (ETSOI) layer, followed by a high-k metal gate (MGHK) on the high-k oxide layer, and a metal region positioned above the MGHK layer.

3. The semiconductor device as recited in claim 2, wherein the high-k oxide layer is made of a material that includes an oxide, a nitride, an oxynitride, or a multilayered stack thereof.

4. The semiconductor device as recited in claim 2, wherein the metal region is made of tungsten.

5. The semiconductor device as recited in claim 1, further comprising at least one spacer added to the gate stack vertical sidewalls.

6. The semiconductor device as recited in claim 5, further comprising a raised source and drain (RSD) on the thin ETSOI extending from the gate stack sidewalls spacer to the spacers isolating the upper thin nitride layer, the thin second buried oxide layer and the thin SOI layer.

7. The semiconductor device as recited in claim 6 wherein the isolation spacer provides isolation between the RSD and the backgate metal.

8. The semiconductor device as recited in claim 1, wherein a voltage is applied to the backgate layer to reduce short channel effects (SCE).

9. The semiconductor device as recited in claim 1, wherein control threshold voltage (Vt) variations are provided by the thin SOI thickness and dopants.

10. The semiconductor device as recited in claim 1, wherein contact trenches are filled with evaporated metal for the backgate layer.

11. The semiconductor device as recited in claim 1, wherein high-k dielectric materials comprise $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof.

12. The semiconductor device as recited in claim 1 further comprising at least one pair of nFET and pFET devices including the encapsulated backgate layer insulated from each other by a shallow trench isolation (STI).

13. The semiconductor device as recited in claim 1 wherein the ETSOI layer superimposed on a buried oxide layer that is encapsulated by surrounding isolation spacers has a thickness ranging from 6 nm to 8 nm.

* * * * *